United States Patent
Hecht et al.

(10) Patent No.: US 12,313,805 B1
(45) Date of Patent: May 27, 2025

(54) MAILPIECE MAGNETIC INK CONTENT RECOGNITION DETECTION SYSTEM

(71) Applicant: Tritek Technologies, Inc., Wilmington, DE (US)

(72) Inventors: Kurt Hecht, Rydal, PA (US); James Malatesta, Hockessin, DE (US); Richard DiDomizio, Hatfield, PA (US)

(73) Assignee: TRITEK TECHNOLOGIES, INC., Wilmington, DE (US)

( * ) Notice: Subject to any disclaimer, the term of this patent is extended or adjusted under 35 U.S.C. 154(b) by 0 days.

(21) Appl. No.: 19/056,475

(22) Filed: Feb. 18, 2025

(51) Int. Cl.
| | |
|---|---|
| *G01V 3/08* | (2006.01) |
| *G01N 27/72* | (2006.01) |
| *G01N 27/82* | (2006.01) |
| *G01R 33/12* | (2006.01) |
| *G01V 3/15* | (2006.01) |

(52) U.S. Cl.
CPC ............... *G01V 3/08* (2013.01); *G01N 27/72* (2013.01); *G01N 27/82* (2013.01); *G01V 3/15* (2013.01); *G01R 33/12* (2013.01); *G01R 33/1215* (2013.01)

(58) Field of Classification Search
CPC . G01V 3/08; G01V 3/15; G01N 27/72; G01N 27/82; G01R 33/12; G01R 33/1215
USPC .......................................................... 324/228
See application file for complete search history.

(56) References Cited

U.S. PATENT DOCUMENTS

| | | | | |
|---|---|---|---|---|
| 2004/0164735 | A1* | 8/2004 | Hurlimann | G01V 3/32 324/303 |
| 2012/0306501 | A1* | 12/2012 | Schmidt | G01V 3/26 324/345 |
| 2016/0032712 | A1* | 2/2016 | Frosell | E21B 47/092 324/346 |

* cited by examiner

*Primary Examiner* — Raul J Rios Russo
(74) *Attorney, Agent, or Firm* — Devlin Law Firm LLC

(57) ABSTRACT

A mailpiece magnetic ink content (MIC) recognition detection system includes a first MIC mailpiece detector and a second MIC mailpiece detector that are coupled to an isolation assembly that isolates the MIC mailpiece detectors from the mailpiece transport system to reduce vibrations and improve sensitivity and accuracy of detecting magnetic sensitive materials in a mailpiece. A mailpiece having a magnetic material, such as a magnetic ink moves through the mailpiece transport system along the mailpiece transport axis and past the first and second MIC mailpiece detectors. The first MIC mailpiece detector is configured on a first side of the mailpiece, front for example, and the second MIC mailpiece detector is configured on a second side of the mailpiece, the back, to enable better detection of any magnetic material on and/or in the mailpiece.

19 Claims, 13 Drawing Sheets

MAILPIECE MAGNETIC INK CONTENT RECOGNITION DETECTION SYSTEM

BACKGROUND OF THE INVENTION

Field of the Invention

The invention relates to a mailpiece magnetic ink content (MIC) detection system that utilizes one or a pair MIC mailpiece detectors each with read heads configured in a column that extends orthogonal to a mailpiece transport axis and an isolation assembly that isolates the one or two MIC mailpiece detectors from the mail transport system.

Background

Mail is sometimes analyzed for the presence of magnetic materials, such as magnetic inks or materials, such as metals that are attracted to magnets. Banking and other financial institutions often sort the mail and use various technology to identify mailpieces with magnetic inks, such as checks. Mail detected to contain magnetic materials, such as magnetic inks may be withdrawn from the mail-stream for further review. Checks may have a higher priority for review than other mailpieces.

SUMMARY OF THE INVENTION

A mailpiece magnetic ink content (MIC) detection system includes a first MIC mailpiece detector and a second MIC mailpiece detector that are coupled to an isolation assembly that isolates the MIC mailpiece detectors from the mailpiece transport system to reduce vibrations and improve sensitivity and accuracy of detecting magnetic sensitive materials in a mailpiece. A mailpiece having a magnetic material, such as a magnetic ink moves through the mailpiece transport system along the mailpiece transport axis and past the first and second MIC mailpiece detectors. The first MIC mailpiece detector is configured on a first side of the mailpiece, front for example, and the second MIC mailpiece detector is configured on a second side of the mailpiece, the back, to enable better detection of any magnetic material on and/or in the mailpiece. Pressure rollers are configured to press the mailpiece against the first and second MIC mailpiece detectors to remove air from the mailpiece to improve detection sensitivity. The mailpiece transport system may also include a plurality of belt rollers and mail transport belts to move the mailpiece to and past the first and second MIC mailpiece detectors. The mailpiece transport system may create vibrations that can interfere with the detection of magnetic material on a mailpiece and an isolation assembly may be configured to isolate the MIC mailpiece detectors from the mailpiece transport system such as from the mail transport frame and/or from the mail transport mount.

The MIC mailpiece detection system is coupled to a mailpiece transport system that includes a mail transport mount, or top surface for retaining the belt rollers, pressure rollers and belts. The MIC mailpiece detection system includes first MIC mailpiece detector and a second MIC mailpiece detector coupled to an isolation assembly that isolates the MIC mailpiece detectors from the mailpiece transport system. A photoeye is configured to detect a mailpiece leading edge and length and is coupled with the MIC mailpiece detection system such that the MIC mailpiece detectors correlate a reading with an identified mailpiece, identified by the photoeye.

An exemplary isolation assembly includes an isolation bar having a connection portion that extends from a first read head portion to a second read head portion that may be offset along the mailpiece transport axis and therefore may have a Z-shape. An isolation bar may be a plate that is planar having mounts for the first and second read head portions and a connection portion that extends between the two mounts. A first read head mount is configured to receive the first MIC mailpiece detector and read head isolation mounts are configured between and couple the first read head mount and first MIC mailpiece detector to the isolation bar. A second read head mount is configured to receive the second MIC mailpiece detector and read head isolation mounts are configured between and couple the second read head mount and second MIC mailpiece detector to the isolation bar. Isolation bar frame brackets couple the isolation bar to a mail transport system via isolation bar isolation mounts, respectively. This series of isolation mounts improves mechanical isolation better than a single layer or series of isolation mounts. The isolation bar may have a Z-shape as the connection portion extends across a mailpiece transport axis from a first read head portion to a second read head portion and wherein the first and second read head portions are offset along the mailpiece transport axis.

An exemplary MIC mailpiece detection system includes an isolation bar isolated from a mailpiece transport system to reduce vibrations and improve sensitivity and accuracy of detecting magnetic sensitive materials in a mailpiece. The mailpiece is moved through the MIC mailpiece detection system via the mailpiece transport system, wherein a first MIC mailpiece detector is configured on first side of the mailpiece and a second MIC mailpiece detector is configured on a second side of the mailpiece. The isolation bar extends from the first side to the second side of the mailpiece and the connection portion of the isolation bar extends across the mailpiece transport axis and under the mailpieces as they move through the system.

A MIC mailpiece detector has a magnetic excitation portion that includes magnets to excite a magnetic sensitive material, such as magnetic ink that may be or include a magnetic ink or magnetic tone on a mailpiece. A magnetic sensitive material may be a metal that is attracted to a magnet, or a magnet or magnetic material such as a magnetic ink. A magnetic excitation portion has a tapered leading edge, a vertical single edge cowcatcher, to reduce vibrations from the mailpiece hitting the magnetic excitation portion. The MIC mailpiece detector also has a read head portion that includes a plurality of read heads configured in a pair of columns, wherein the read heads of the first read head column are offset along the mailpiece transport axis with respect to the read heads of the second read head column. Also, the read heads of the first and second read head columns may be staggered orthogonally to the mailpiece transport axis to produce a staggered arrangement, or zig-zag arrangement, of read heads extending orthogonal to the mailpiece transport axis. This arrangement closes coverage gaps in the vertical direction or orthogonal to the mailpiece transport axis direction. The detector heads have a center portion that is active for sensing magnetic sensitive material and if only one column of heads was used, there would be sensing gaps between the read heads that would not effectively detect magnetic sensitive material. A single column would result in vertical coverage gaps. Put another way, the two columns of read heads are offset in the mailpiece transport axis and alternate orthogonal to the mailpiece transport axis from the first read head column to the second read head column to produce a staggered or zig-zag arrangement that minimizes or eliminates coverage gaps, such that a read head is configured continuously along the vertical or orthogonal to the mailpiece transport axis direction.

In an exemplary embodiment, the magnetic excitation portion and the read head portion are separate pieces and have a separation gap therebetween and this further helps to reduce vibration of the read head portion due to the mailpiece hitting the magnetic excitation portion as the mailpieces move through the system.

An exemplary MIC mailpiece detection system includes an isolation bar with a first MIC mailpiece detector configured on first read head portion and first side of the mailpiece, and a second MIC mailpiece detector configured on a second read head portion of the isolation bar and on a second side of a mailpiece. The isolation bar extends from the first side to the second side of the mailpiece and the connection portion of the isolation bar extends across the mailpiece transport axis.

An exemplary MIC mailpiece detector has a magnetic excitation portion and a read head portion and is coupled to an isolation assembly via the read head isolation mounts that extend to the isolation bar that is coupled to a mailpiece transport system by an isolation bar frame bracket and isolation bar isolation mounts. The MIC mailpiece detector is mechanically isolated from the mailpiece transport system by two series of isolation mounts, the isolation bar isolation mounts and the read head isolation mounts to effectively isolate the MIC mailpiece detector from the mailpiece transport system. The isolation assembly may include a plurality of read head isolation mounts for each of the first and second MIC mailpiece detector, such as two or more, three or more, four or more or event five or six or more. Likewise, a plurality of isolation bar isolation mounts may be configured between the isolation bar frame bracket and the mailpiece transport system such as two or more, three or more, four or more or event five or six or more.

The magnetic excitation portion may include a single magnet and the magnet may have a flat or planar excitation surface that is exposed on the magnetic excitation portion of the MIC mailpiece detector. In an exemplary embodiment, each magnetic excitation portion has two flat magnets that have a length axis that is configured at an offset angle from the mailpiece transport axis to provide increased magnetic excitation exposure time to the mailpiece as it passes by the magnetic excitation portion.

A mailpiece, as used herein, is a planar mailpiece including but not limited to an envelope that may be rectangular and thin, having a thickness from a front side to a back side of no more than about 5 mm and preferably no more than 3 mm or even 2 mm or 1 mm; a mailpiece may form an enclosure and a document may be retained within the envelope.

As used herein, "magnetic sensitive materials on a mailpiece" means that the magnetic sensitive material may be on the mailpiece, such as on the envelope and/or on a document retained within an envelope or enclosure of the mailpiece.

The summary of the invention is provided as a general introduction to some of the embodiments of the invention and is not intended to be limiting. Additional example embodiments including variations and alternative configurations of the invention are provided herein.

BRIEF DESCRIPTION OF SEVERAL VIEWS OF THE DRAWINGS

The accompanying drawings are included to provide a further understanding of the invention and are incorporated in and constitute a part of this specification, illustrate embodiments of the invention, and together with the description serve to explain the principles of the invention.

Figure 1:
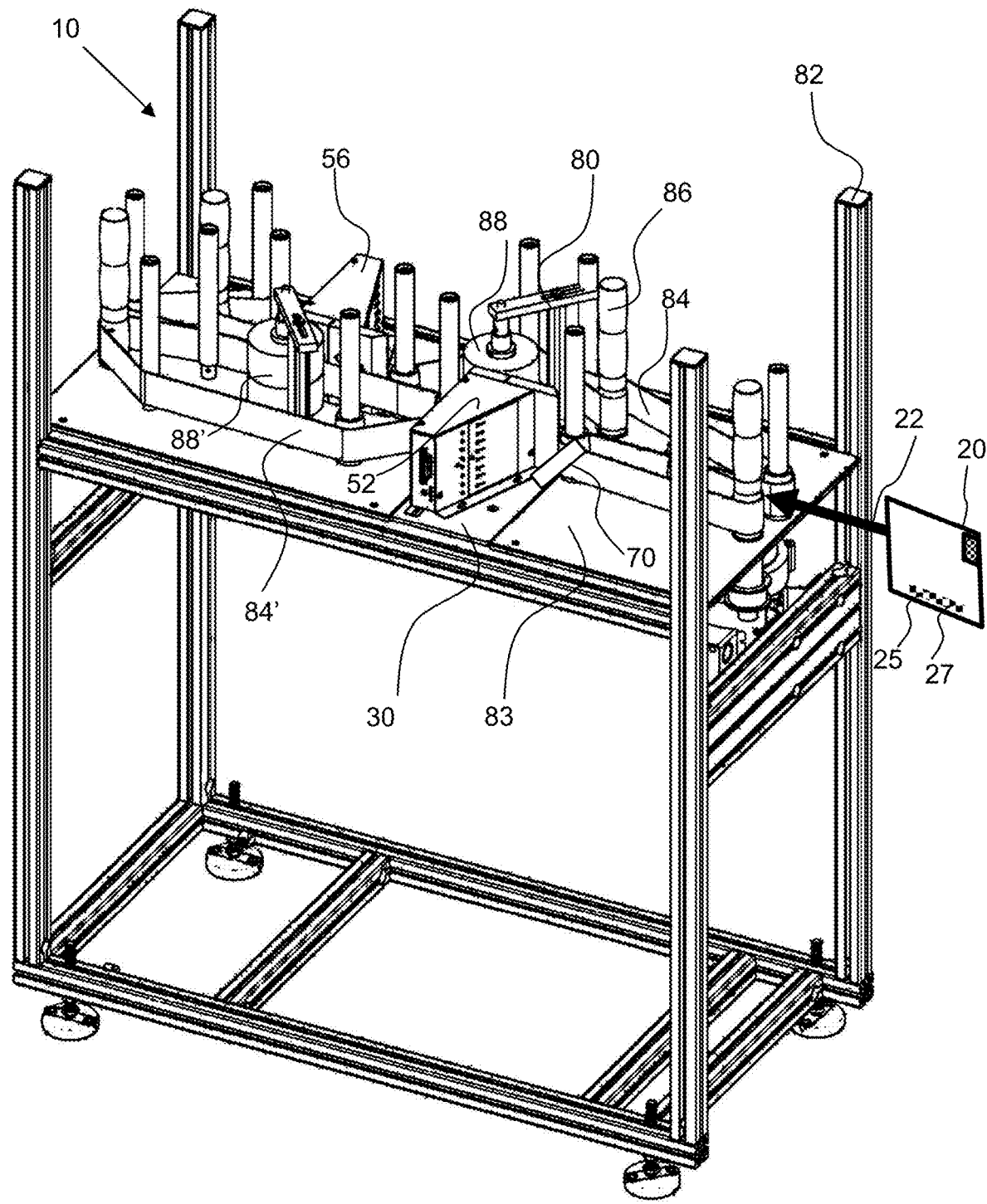
FIG. 1 shows a MIC mailpiece detection system including a pair of MIC mailpiece detectors coupled to an Isolation assembly that isolates the MIC mailpiece detectors from the mailpiece transport system to reduce vibrations and improve sensitivity and accuracy of detecting magnetic sensitive materials in a mailpiece.

Corresponding reference characters indicate corresponding parts throughout the several views of the figures. The figures represent an illustration of some of the embodiments of the present invention and are not to be construed as limiting the scope of the invention in any manner. Some of the figures may not show all of the features and components of the invention for ease of illustration, but it is to be understood that where possible, features and components from one figure may be included in the other figures. Further, the figures are not necessarily to scale, some features may be exaggerated to show details of particular components. Therefore, specific structural and functional details disclosed herein are not to be interpreted as limiting, but merely as a representative basis for teaching one skilled in the art to employ the present invention.

DETAILED DESCRIPTION OF THE ILLUSTRATED EMBODIMENTS

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Also, use of "a" or "an" are employed to describe elements and components described herein. This is done merely for convenience and to give a general sense of the scope of the invention. This description should be read to include one or at least one and the singular also includes the plural unless it is obvious that it is meant otherwise.

Certain exemplary embodiments of the present invention are described herein and are illustrated in the accompanying figures. The embodiments described are only for purposes of illustrating the present invention and should not be interpreted as limiting the scope of the invention. Other embodiments of the invention, and certain modifications, combinations and improvements of the described embodiments, will occur to those skilled in the art and all such alternate embodiments, combinations, modifications, improvements are within the scope of the present invention.

As shown in FIG. 1, a MIC mailpiece detection system 10 includes a first MIC mailpiece detector 52 and a second MIC mailpiece detector 56 that are coupled to an isolation assembly 30 that isolates the MIC mailpiece detectors from the mailpiece transport system 80 to reduce vibrations and improve sensitivity and accuracy of detecting magnetic sensitive materials in a mailpiece. A mailpiece 20, having a magnetic sensitive material 25, such as a magnetic ink 27, moves through the mailpiece transport system 80 along the mailpiece transport axis 22 and past the first and second MIC mailpiece detectors. The first MIC mailpiece detector 52 is configured on a first side of the mailpiece transport axis and first side of the mailpiece, such as the front of the mailpiece, and the second MIC mailpiece detector 56 is configured on a second side of the mailpiece transport axis and second side of the mailpiece, such as the back as shown, to enable better detection of any magnetic material on and/or in the mailpiece. Pressure rollers 88, 88' are configured to press the mailpiece against the first MIC mailpiece detector 52 and a second MIC mailpiece detector 56, respectively. The pressure rollers may be spring or pneumatic actuated against the mailpiece detectors and are configured to press the air out of the envelope to improved magnetic sensitive material detection. The mailpiece transport system 80 also includes a plurality of belt rollers and mail transport belts 84, 84'. The mailpiece transport system 80 may create vibrations that can interfere with the detection of magnetic material on a mailpiece and an isolation assembly 30 may be configured to isolate the MIC mailpiece detectors from the mailpiece transport system 80 such as from the mail transport frame 82 and/or from the mail transport mount 83.

Figure 2:
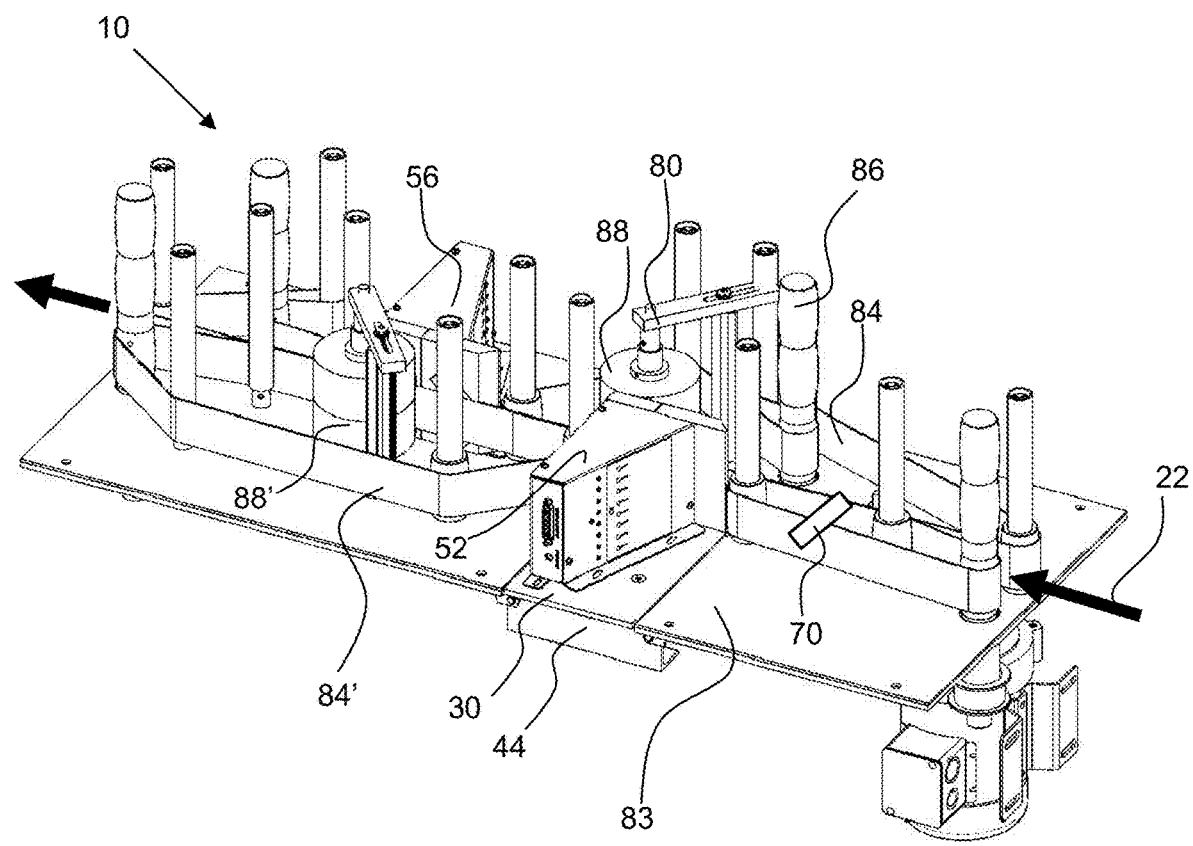
FIG. 2 shows a front perspective view of the MIC mailpiece detection system and a portion of the mailpiece transport system including a mail transport mount, or top surface for retaining the belt rollers, pressure rollers, belt and the like, wherein the MICR mailpiece detection system includes a pair of MIC mailpiece detectors coupled to an isolation assembly that isolates the MIC mailpiece detectors from the mailpiece transport system.
Figure 3:
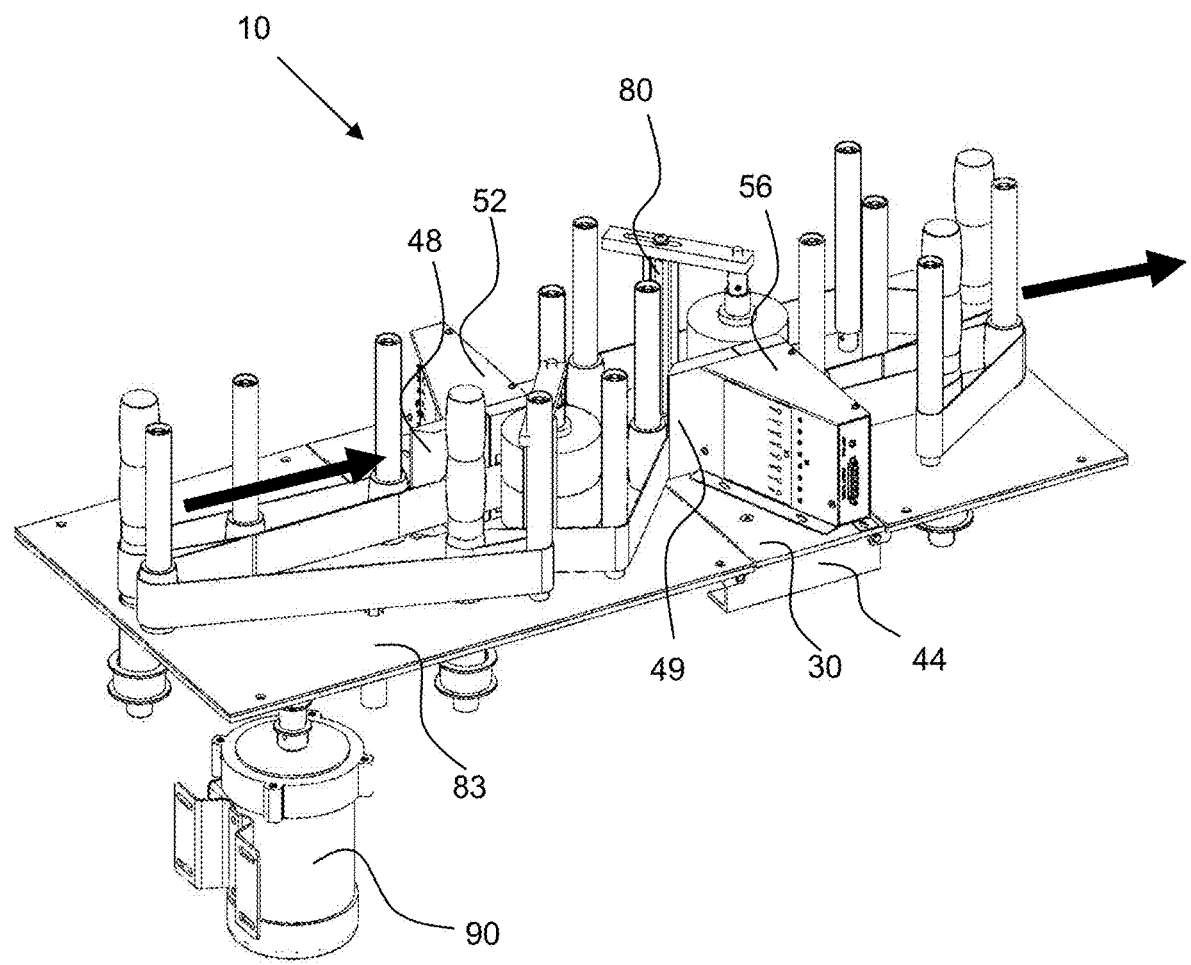
FIG. 3 shows a back perspective view of the MIC mailpiece detection system and a portion of the mailpiece transport system including a mail transport mount, or top surface for retaining the belt rollers, pressure rollers, belt and the like, wherein the MICR mailpiece detection system includes a pair of MIC mailpiece detectors coupled to an isolation assembly that isolates the MIC mailpiece detectors from the mailpiece transport system.

Referring now to FIGS. 2 and 3, the MIC mailpiece detection system 10 is coupled to a mailpiece transport system 80 that includes a mail transport mount 83, or top surface for retaining the belt rollers 86, pressure rollers 88, 88' and mail transport belts 84, 84'. The MICR mailpiece detection system 10 includes a first MIC mailpiece detector 52 and a second MIC mailpiece detector 56 that are coupled to an isolation assembly 30 that isolates the MIC mailpiece detectors from the mailpiece transport system 80. A photo-eye 70 is configured to detect a mailpiece leading edge and length and is coupled with the MIC mailpiece detection system 10 such that the MIC mailpiece detectors correlate a reading with an identified mailpiece, identified by the photoeye.

Figure 4:
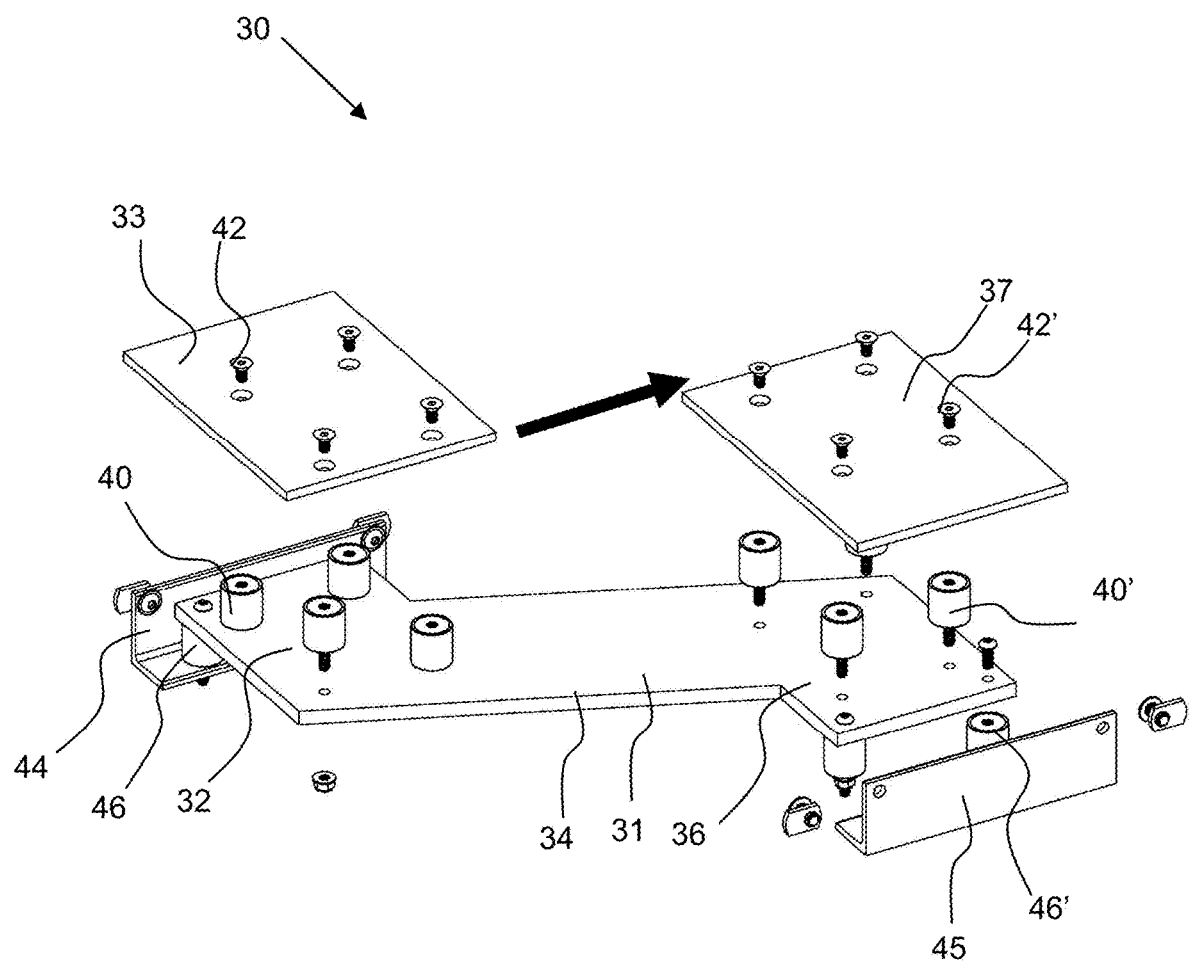
FIG. 4 shows an exploded perspective view of an exemplary isolation assembly including an isolation bar with a connection portion that extends from a first read head portion to a second read head portion and mounts for each of the first and second MIC mailpiece detectors that are coupled to the isolation bar by read head isolation mounts, and an isolation bar frame bracket that couples the isolation bar to a mail transport system via isolation bar isolation mounts.
Figure 5:
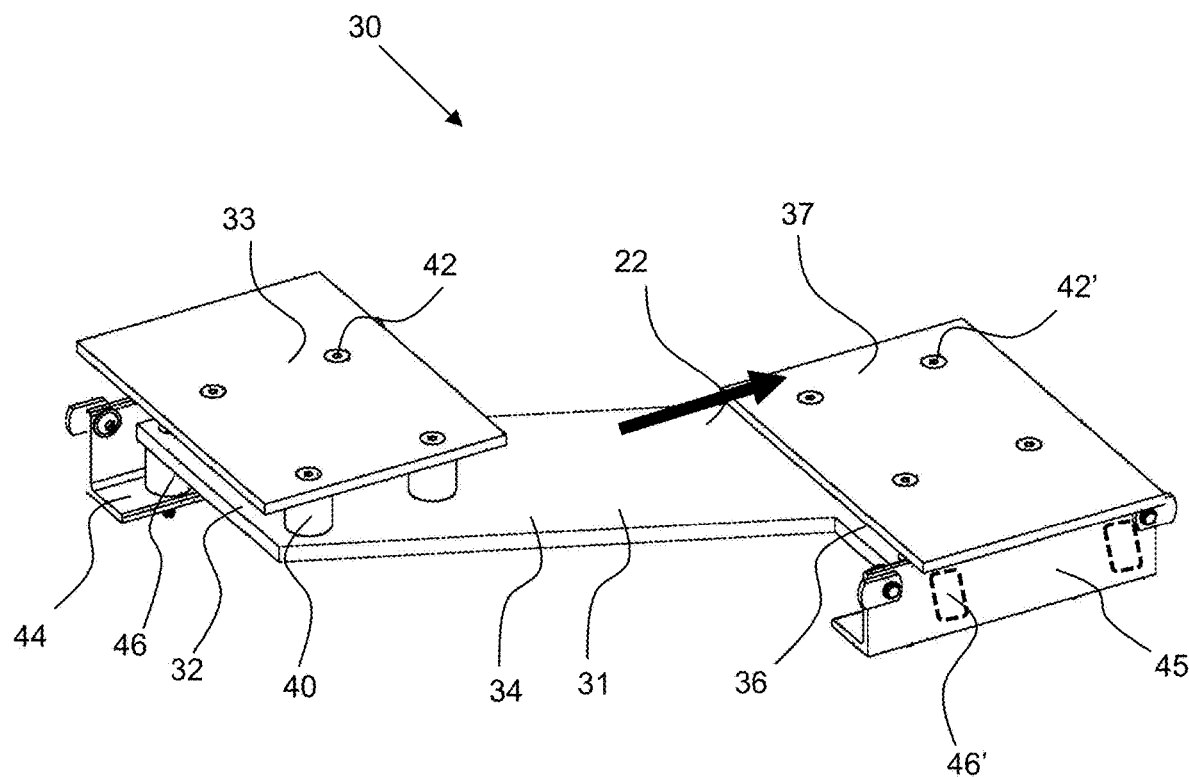
FIG. 5 shows a perspective view of the exemplary isolation assembly shown in FIG. 4 and now assembled.

Referring now to FIGS. 4 and 5, an exemplary isolation assembly 30 includes an isolation bar 31 having a connection portion 34 that extends from a first read head portion 32 to a second read head portion 36. A first read head mount 33 is configured to receive the first MIC mailpiece detector 52 and the read head isolation mounts 40 are configured between and couple the first read head mount 33 and first MIC mailpiece detector 52 to the isolation bar 31. A second read head mount 37 is configured to receive the second MIC mailpiece detector 56 and read head isolation mounts 40' are configured between and couple the second read head mount 37 and second MIC mailpiece detector 56 to the isolation bar 31. The first read head mount 33 is coupled to the first read head portion 32 of the Isolation bar 31 by mount fasteners 42, and the second read head mount 37 is secured to the second read head portion 36 of the Isolation bar 31 by mount fasteners 42'. The Isolation bar frame brackets 44, 45 couple the isolation bar 31 to a mail transport system via isolation bar isolation mounts 46, 46', respectively. This series of isolation mounts improves mechanical isolation better than a single layer or series of isolation mounts.

Figure 6:
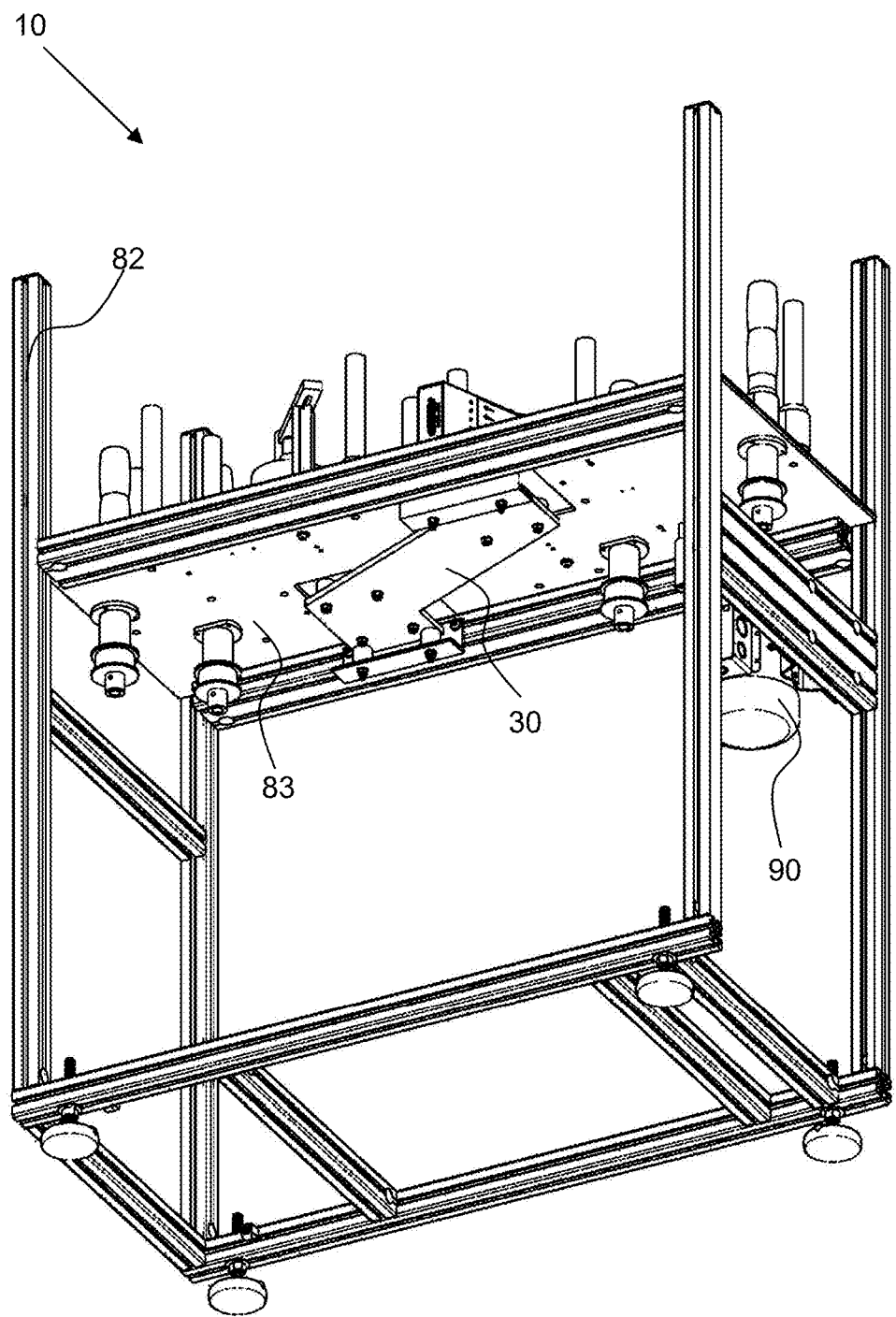
FIG. 6 shows a bottom perspective view of the exemplary MIC mailpiece detection system including an isolation bar isolated from a mailpiece transport system to reduce vibrations and improve sensitivity and accuracy of detecting magnetic sensitive materials in a mailpiece.

FIG. 6 shows a bottom perspective view of the exemplary MIC mailpiece detection system 10 including an isolation bar 31 isolated from a mailpiece transport system 80, such as the mail transport frame 82 and/or mail transport mount 83 to reduce vibrations and improve sensitivity and accuracy of detecting magnetic sensitive materials in a mailpiece.

Figure 7:
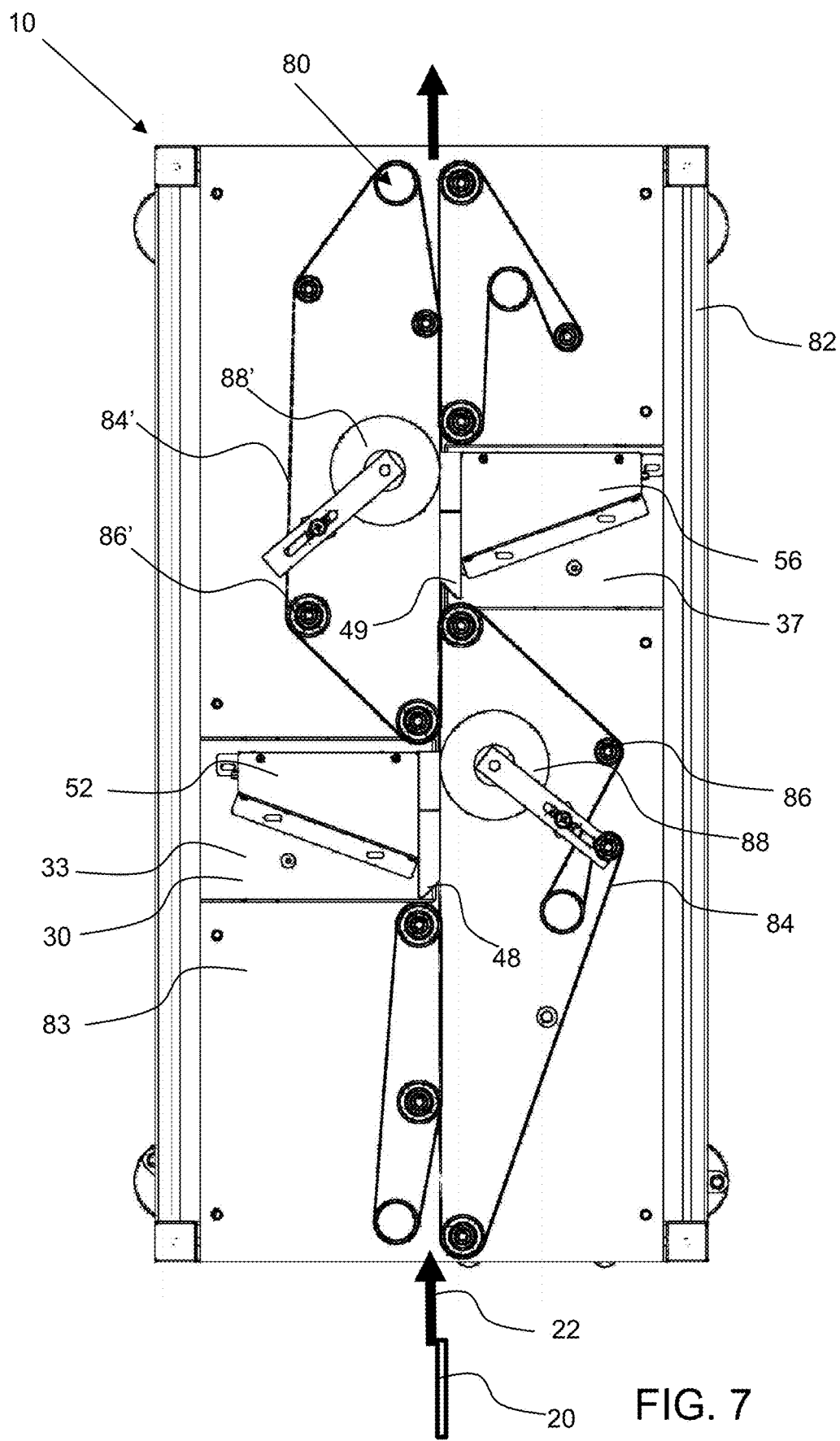
FIG. 7 shows a top view of the exemplary MIC mailpiece detection system including an isolation bar isolated from a mailpiece transport system to reduce vibrations and improve sensitivity and accuracy of detecting magnetic sensitive materials in a mailpiece.

As shown in FIG. 7, the exemplary MIC mailpiece detection system 10 includes an isolation bar 31 isolated from a mailpiece transport system 80 to reduce vibrations and improve sensitivity and accuracy of detecting magnetic sensitive materials in a mailpiece. The mailpiece 20 is moved through the MIC mailpiece detection system 10 via the mailpiece transport system 80 wherein a first MIC mailpiece detector 52 is configured on first side of the mailpiece 20 and a second MIC mailpiece detector 56 is configured on a second side of the mailpiece 20. The isolation bar extends from the first side to the second side of the mailpiece and the connection portion of the isolation bar extends across the mailpiece transport axis 22 but in a lower vertical plane.

Figure 8:
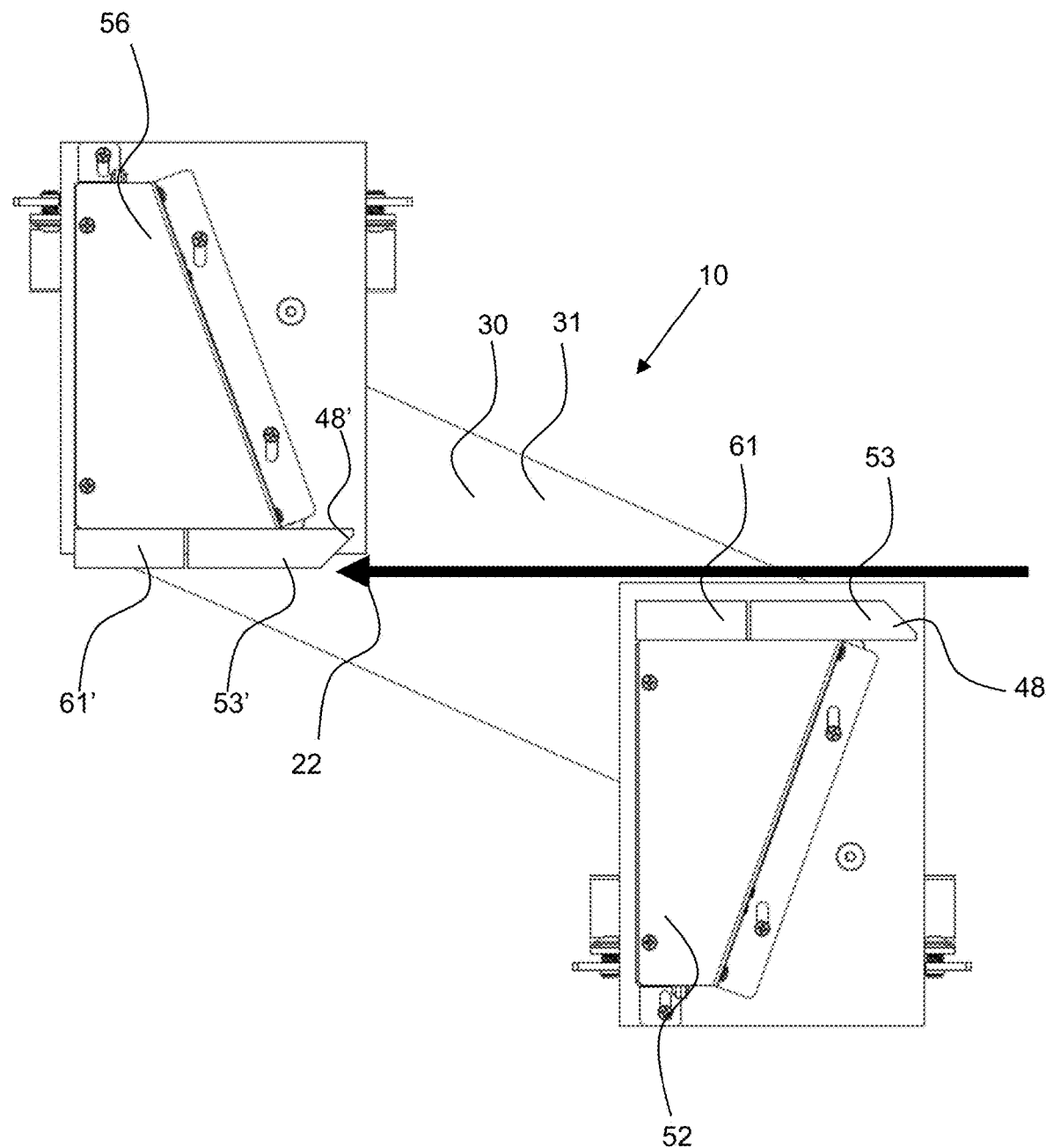
FIG. 8 shows an isolation system including an isolation bar with a first and second MIC mailpiece detector coupled thereto to scan both sides of a mailpiece as it moves through the MIC mailpiece detection system.

FIG. 8 shows the isolation system 30 including the isolation bar 31 with the first MIC mailpiece detector 52 and second MIC mailpiece detector 56 coupled thereto to scan both sides of a mailpiece as it moves through the MIC mailpiece detection system.

Figure 9:
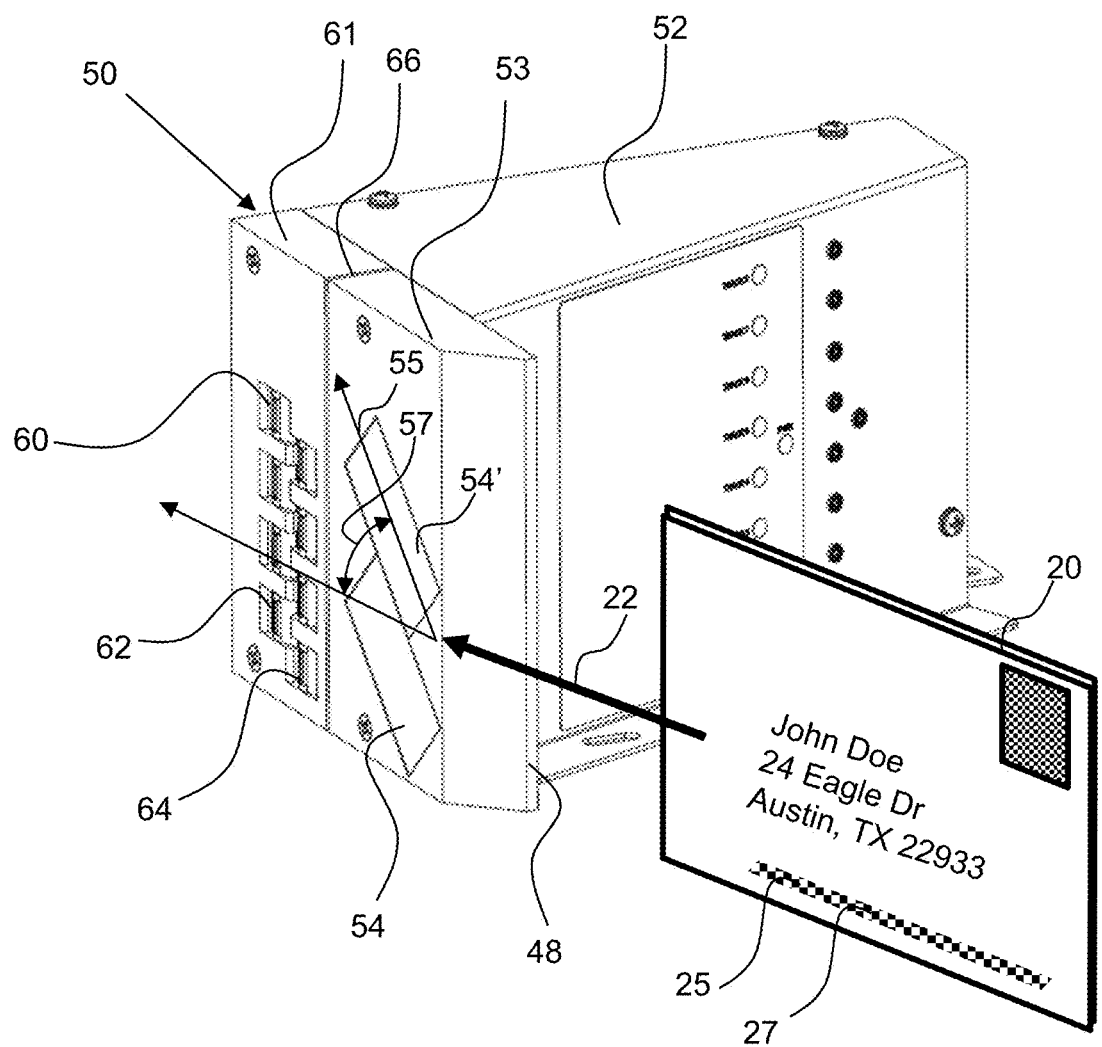
FIG. 9 shows a perspective view of a MIC mailpiece detector having a magnetic excitation portion that includes a magnet to excite a magnetic material on a mailpiece, and a read head portion that includes a plurality of read heads configured in a pair of columns, wherein the read heads of the first read head column are offset with respect to the read heads of the second read head column to produce a staggered arrangement or zig-zag arrangement of read head extending orthogonal to the mailpiece transport axis 22.
Figure 10:
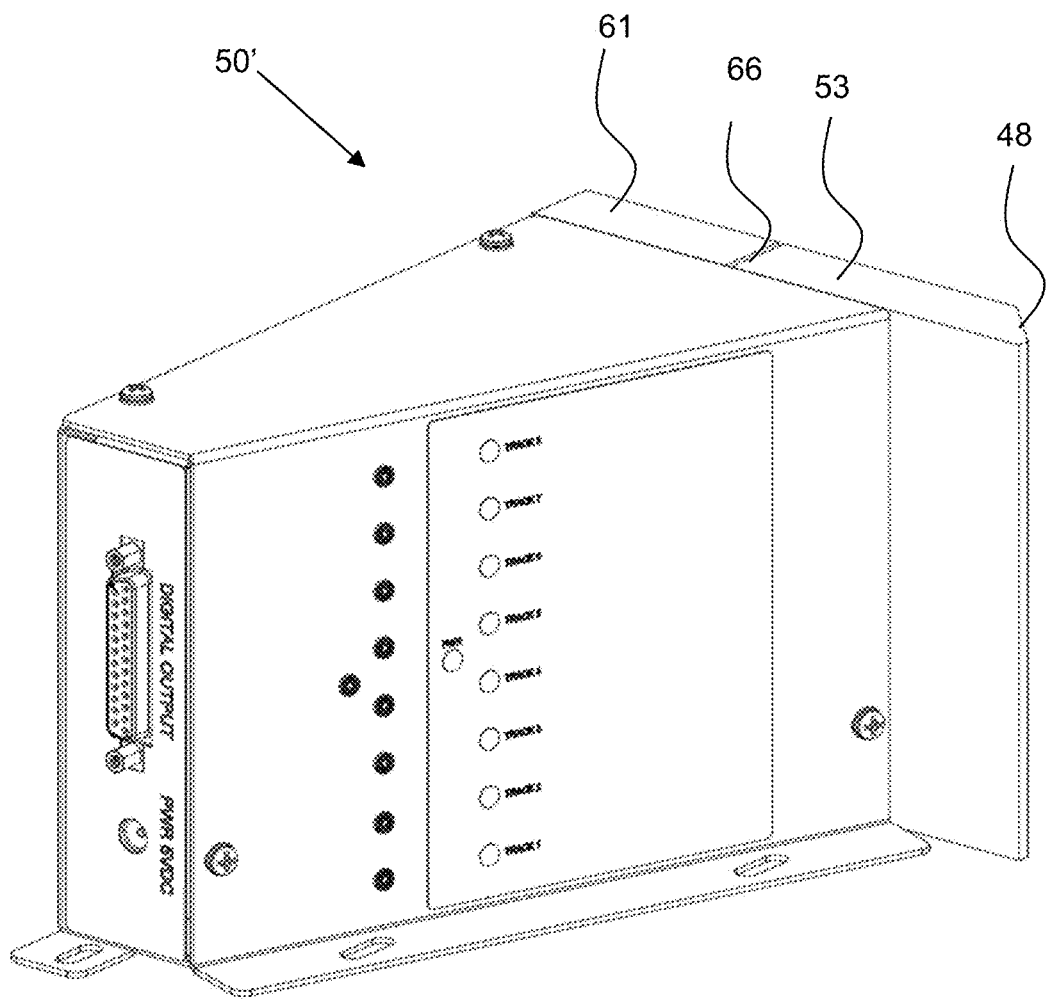
FIG. 10 shows a back perspective view of a MIC mailpiece detector.

Referring now to FIGS. 9 and 10, a MIC mailpiece detector 50 has a magnetic excitation portion 53 that includes magnet 54, 54' to excite a magnetic sensitive material 25, such as magnetic ink 27, on a mailpiece 20. The magnetic excitation portions 53, 53', each have a tapered leading edge 48, 48' a vertical single edge cowcatcher, to reduce vibrations from the mailpiece hitting the magnetic excitation portion. The MIC mailpiece detector 50 also has a read head portion 61 that includes a plurality of read heads 60 configured in a pair of columns, wherein the read heads of the first read head column 62 are offset with respect to the read heads of the second read head column 64 to produce a staggered arrangement or zig-zag arrangement of read head extending orthogonal to the mailpiece transport axis 22. This arrangement closes coverage gaps in the vertical direction. The detector heads only have a center portion active sensing. A single column would result in vertical coverage gaps. The magnetic excitation portion 53 and the read head portion 61 are separate pieces and have a separation gap 66 therebetween and this further helps to reduce vibration of the read head portion 61 due to the mailpiece hitting the magnetic excitation portion 53.

Figure 11:
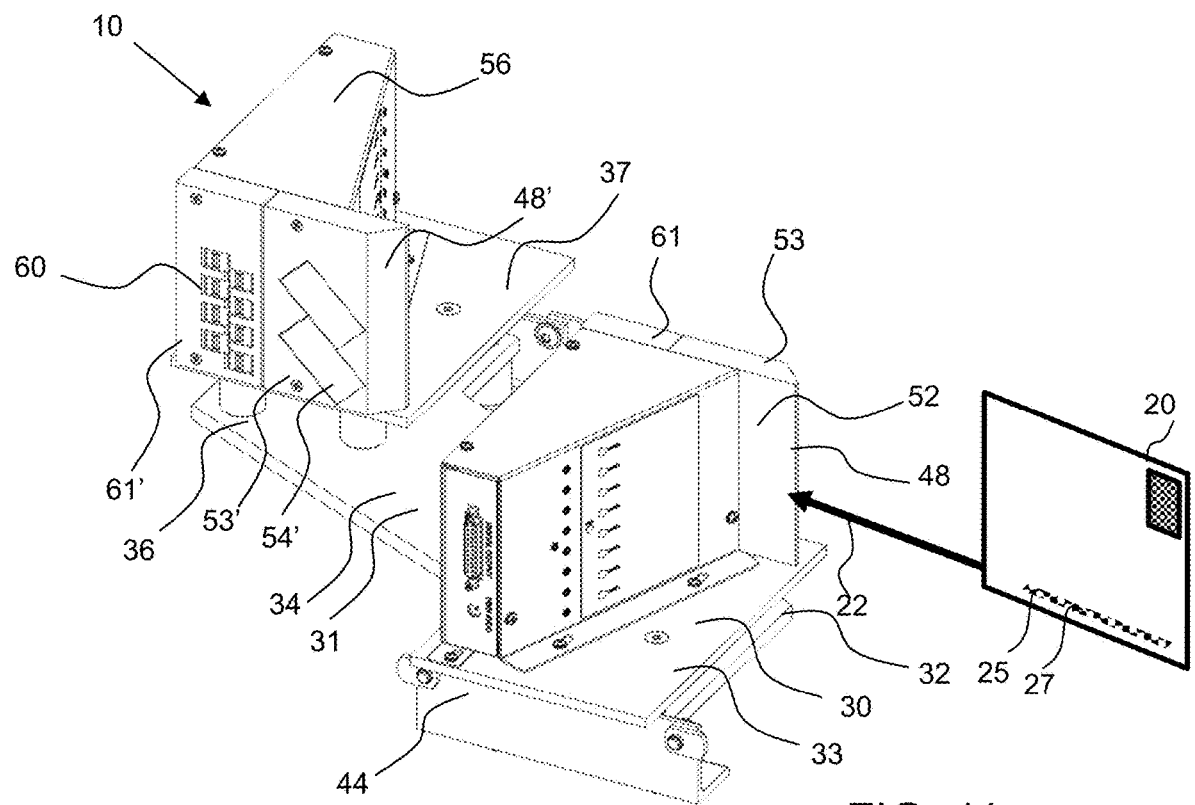
FIG. 11 shows a front perspective view of the pair of MIC mailpiece detectors coupled to an isolation assembly.
Figure 12:
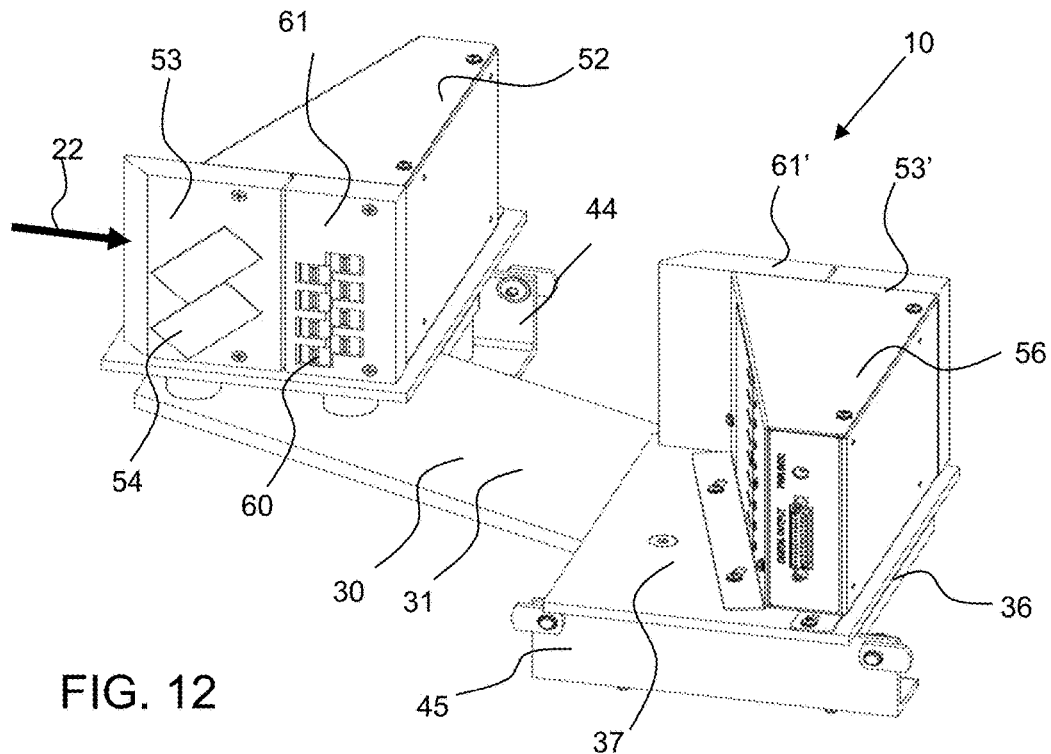
FIG. 12 shows a back perspective view of the pair of MIC mailpiece detectors coupled to an isolation assembly.

Referring now to FIGS. 11 and 12, the exemplary MIC mailpiece detection system 10 includes an isolation bar 31 with a first MIC mailpiece detector 52 is configured on first read head portion and first side of the mailpiece 20, and a second MIC mailpiece detector 56 configured on a second read head portion 36 and on a second side of a mailpiece 20. The isolation bar extends from the first side to the second side of the mailpiece and the connection portion 34 of the isolation bar extends across the mailpiece transport axis 22.

Figure 13:
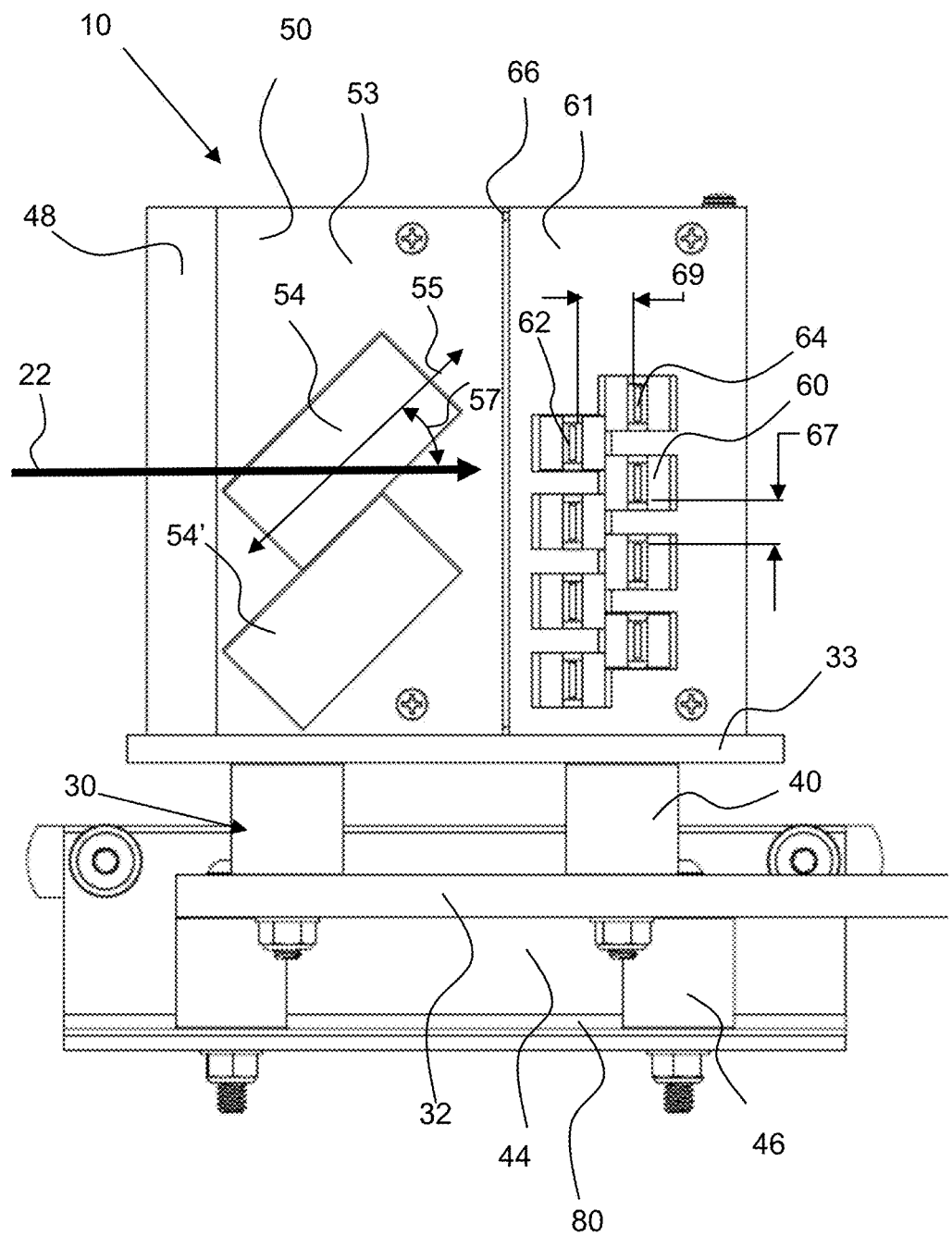
FIG. 13 shows a front view of a MIC mailpiece detector, having a magnetic excitation portion and a read head portion, and coupled to an isolation assembly via read head isolation mounts that extend to an isolation bar that is coupled to a mailpiece transport system by an isolation bar frame bracket and isolation bar isolation mounts.

Referring to FIG. 13, the MIC mailpiece detector 50, has a magnetic excitation portion 53 and a read head portion 61, and coupled to an isolation assembly 30 via read head isolation mounts 40 that extend to an isolation bar 31 that is coupled to a mailpiece transport system 80 by an isolation bar frame bracket 44 and isolation bar isolation mounts 46. The MIC mailpiece detector 50 is mechanically isolated from the mailpiece transport system 80 by two series of isolation mounts, the isolation bar isolation mounts 46 and the read head isolation mounts to effectively isolate the MIC mailpiece detector 50 from the mailpiece transport system 80.

The magnetic excitation portion 53 has two flat magnets 54, 54' that have a length axis 55 that is configured at an offset angle 57 to the mailpiece transport axis 22 to provide increased magnetic excitation exposure time to the mailpiece as it passes by the magnetic excitation portion 53.

The read head portion 61 has a plurality of read heads 60 configured in two columns, a first read head column 62 and a second read head column 64 that are offset from each other a mail-axis offset distance 69, and also the read heads in each of the first and second read head columns are offset a column offset distance 67 and staggered from the first to the second read head column to produce a zig-zap arrangement of read heads to more effectively detect magnetic sensitive material on a mailpiece and to reduce and preferably eliminate any vertical coverage sensing gaps. As shown, each read head has a sensing portion within the read head that is offset from the perimeter of the read head and if only one column of read heads were provided, there would be vertical gaps in sensing between adjacent read heads.

Figure 14:
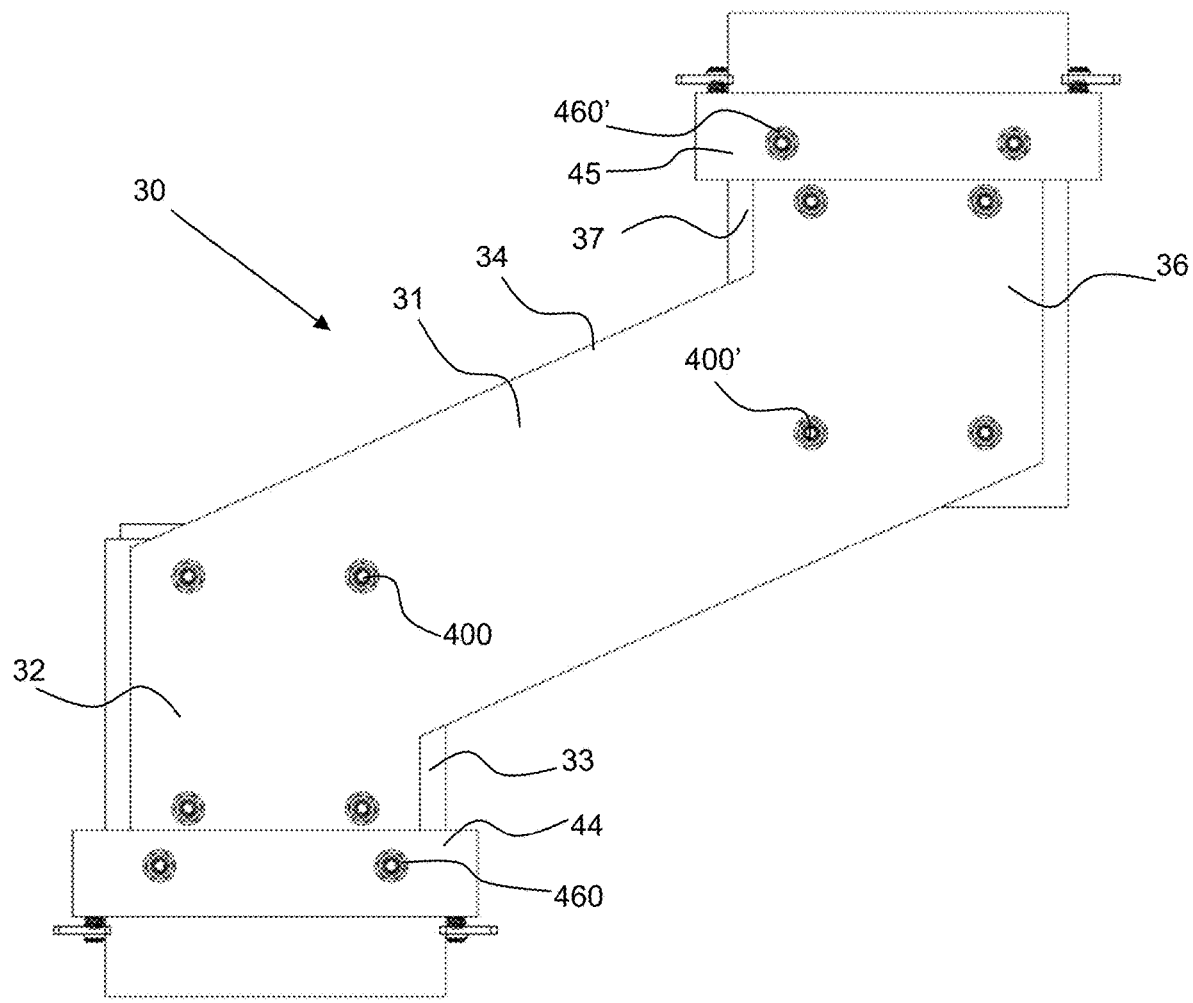
FIG. 14 shows a bottom view of an isolation assembly 30 that includes the isolation bar and the first and second read head mounts and first and second isolation bar frame brackets.

As shown in FIG. 14, an isolation assembly 30 includes the isolation bar 31 and a first read head mount 33 and second read head mount 37 and first and second isolation bar frame brackets 44, 45. The fasteners 400, 400' couple the read head isolation mounts between the isolation bar 31 and the first read head mount 33 and second read head mount 37, respectively. The fasteners 460, 460' couple the isolation bar 31 to the first isolation bar frame bracket 44 and second isolation bar frame bracket 45, respectively.

It will be apparent to those skilled in the art that various modifications, combinations and variations can be made in the present invention without departing from the scope of the invention. Specific embodiments, features and elements described herein may be modified, and/or combined in any suitable manner. Thus, it is intended that the present invention cover the modifications, combinations and variations of this invention provided they come within the scope of the appended claims and their equivalents.

What is claimed is:

1. A magnetic ink content (MIC) mailpiece detection system comprising:
   a) a mailpiece transport system;
   b) a first MIC mailpiece detector coupled to the mailpiece transport system comprising:
      i) a magnetic excitation portion comprising:
         a magnet;
      ii) a read head portion comprising:
         read heads configured in a first read head column that extends at least 60 mm orthogonal to a mailpiece transport axis;
   wherein the first MIC mailpiece detector is coupled to said mailpiece transport system to detect magnetic sensitive material in a flow of a plurality of mailpieces that are moved past the first MIC mailpiece detector by the mailpiece transport system.

2. The MIC mailpiece detection system of claim 1, further comprising a second read head column that is offset along the mailpiece transport axis from the first read head column of read heads and extending at least 60 mm orthogonal to said mailpiece transport axis.

3. The MIC mailpiece detection system of claim 2, wherein the read heads of the first read head column and second read head column are staggered orthogonal to the mailpiece transport axis to form a zig-zag arrangement of the read heads of the first read head column and second read head column.

4. The MIC mailpiece detection system of claim 3, comprising at least three read heads in each of the first read head column and at least three read heads in the second read head column.

5. The MIC mailpiece detection system of claim 1, wherein the magnetic excitation portion is separated from the read head portion of the first MIC mailpiece detector; and
   whereby said separation of the magnetic excitation portion from the read head portion is configured to reduce vibration of the read head portion from vibrating caused by said mailpiece contacting the magnetic excitation portion.

6. The MIC mailpiece detection system of claim 1, wherein the magnet extends at an offset angle to the mailpiece transport axis.

7. The MIC mailpiece detection system of claim 6, wherein the offset angle of the magnet is at least 20 degrees to increase a magnetic field exposure time of moving mailpieces.

8. The MIC mailpiece detection system of claim 6, comprising two magnets, wherein each of said two magnets extend at said offset angle of at least 20 degrees.

9. The MIC mailpiece detection system of claim 8, wherein the two magnets overlap along at least a portion of a length of a first magnet of said two magnets.

10. The MIC mailpiece detection system of claim 8, wherein the two magnets are flat magnets.

11. The MIC mailpiece detection system of claim 1, wherein the magnetic excitation portion has a tapered lead edge to mitigate mailpiece impact effects.

12. The MIC mailpiece detection system of claim 1, comprising a second MIC mailpiece detector and wherein the first MIC mailpiece detector is configured on a first side of said mailpiece as said mailpiece moves through the mailpiece transport system and wherein the second MIC mailpiece detector is configured on a second side, opposite said first side of said mailpiece as said mailpiece moves through the mailpiece transport system.

13. The MIC mailpiece detection system of claim 12, further comprising a vibration isolation assembly comprising:
   a) an isolation bar; and
   b) isolation bar isolation mounts; wherein the isolation bar is coupled to the mail transport system by said isolation bar isolation mounts and wherein the first MIC mailpiece detector and second MIC mailpiece detector are coupled to the bar and vibration isolated from said mail transport system.

14. The MIC mailpiece detection system of claim 13, wherein the vibration isolation assembly comprises:
   a) a first read head portion;
   b) a second read head portion; and
   c) a connection portion that extends from said first read head portion to said second read head portion and across the mailpiece transport axis.

15. The MIC mailpiece detection system of claim 14, wherein each of the first MIC mailpiece detector and second MIC mailpiece detector are coupled to the mail transport system by at least two isolation bar isolation mounts.

16. The MIC mailpiece detection system of claim 15, further comprising read head isolation mounts and wherein the first MIC mailpiece detector and second MIC mailpiece detector are coupled to the vibration isolation assembly by at least two of said read head isolation mounts.

17. The MIC mailpiece detection system of claim 15, wherein the vibration isolation assembly further comprises an isolation bar frame brackets and wherein the Isolation bar is coupled to the isolation frame brackets by the isolation bar isolation mounts and wherein the Isolation bar frame brackets are coupled to the mail transport system.

18. A method of detecting a magnetic sensitive material on a mailpiece comprising:
   a) providing the MIC mailpiece detection system as described in claim 16;
   b) moving a mailpiece by the mailpiece transport system past the first MIC detector wherein a first side of the mailpiece passes by the magnetic excitation portion of the first MIC detector to magnetically excite said magnetic sensitive material;
   c) moving the mailpiece past the read head portion of the first MIC detector wherein a first side of the mailpiece passes by the read head of the first MIC detector to detect magnetic material on the mailpiece and to produce a first magnetic signal including an individual signal from each of the read heads of the read head portion of the first MIC detector;
   d) moving a mailpiece by the mailpiece transport system past the second MIC detector wherein a second side of the mailpiece passes by the magnetic excitation portion of the second MIC detector to magnetically excite said magnetic material;
   e) moving the mailpiece past the read head portion of the second MIC detector wherein a second side of the mailpiece passes by the read head of the second MIC detector to detect magnetic material on the mailpiece and to produce a second magnetic signal including an individual signal from each of the read heads of the read head portion of the second MIC detector;
   f) analyzing the first and second magnetic signals to detect said magnetic material on said mailpiece.

19. The method of detecting a magnetic material of claim 18, wherein said analysis determines if the magnetic material is metal or magnetic ink.

* * * * *